United States Patent [19]

Bloothoofd

[11] 4,403,566
[45] Sep. 13, 1983

[54] APPARATUS FOR PRODUCING A PRINTING PLATE

[75] Inventor: William Bloothoofd, Wilmington, Del.

[73] Assignee: Hercules Incorporated, Wilmington, Del.

[21] Appl. No.: 315,092

[22] Filed: Oct. 26, 1981

Related U.S. Application Data

[63] Continuation-in-part of Ser. No. 161,847, Jun. 23, 1980, abandoned.

[51] Int. Cl.³ .............................................. B05C 5/02
[52] U.S. Cl. .................................. 118/407; 118/401; 118/120
[58] Field of Search .............. 118/407, 412, 413, 415, 118/DIG. 4, 410, 411, 401, 120

[56] References Cited

U.S. PATENT DOCUMENTS

| 1,494,316 | 5/1924 | Ostenberg | 118/413 |
|---|---|---|---|
| 2,001,488 | 5/1935 | Drobile | 118/415 X |
| 2,247,010 | 6/1941 | Bishop, Jr. | 118/415 |
| 3,145,410 | 8/1964 | Stahl | 118/100 |
| 3,239,871 | 3/1966 | Lemieux et al. | 118/415 X |
| 3,520,606 | 7/1970 | Gush et al. | 355/85 |
| 3,556,791 | 1/1971 | Suzuke et al. | |
| 3,605,689 | 9/1971 | Sherwood | 118/407 |
| 3,628,963 | 12/1971 | Akamatsu et al. | |
| 3,635,711 | 1/1972 | Miller et al. | 430/309 |
| 3,661,575 | 5/1972 | Ketley et al. | 430/307 |
| 3,663,222 | 5/1972 | Akamatsu et al. | 430/325 |
| 3,687,785 | 8/1972 | Akamatsu et al. | 156/501 |
| 3,729,256 | 4/1973 | Westfall et al. | 355/18 |
| 3,751,164 | 8/1973 | Miller et al. | 355/100 |
| 3,782,327 | 1/1974 | Wessells et al. | |
| 3,794,494 | 2/1974 | Saitama et al. | |
| 3,832,177 | 8/1974 | Akamatsu et al. | 430/347 |
| 3,837,887 | 9/1974 | Akamatsu et al. | 430/270 |
| 3,848,998 | 11/1974 | Yonekura et al. | 355/100 |
| 3,858,510 | 1/1975 | Kai et al. | |
| 3,890,922 | 6/1975 | Nordenholt | 118/7 |
| 3,903,541 | 9/1975 | VonMeister et al. | 354/317 |
| 3,957,015 | 5/1976 | Harris | 355/125 X |
| 3,960,572 | 6/1976 | Ibata et al. | |
| 3,971,691 | 7/1976 | Cairns | 156/497 |
| 4,056,423 | 11/1977 | Hughs | 355/85 X |
| 4,214,942 | 7/1980 | Inoko et al. | 156/500 |

*Primary Examiner*—John P. McIntosh
*Attorney, Agent, or Firm*—Marion C. Staves

[57] ABSTRACT

An apparatus and method is disclosed which will rapidly provide a uniform layer of photopolymerizable material for a printing plate. A regulated flow of liquid photopolymerizable resin is supplied from an external reservoir into a manifold which is approximately C-shaped in cross-section and has one at least partially open side face. A gate is disposed before the open side face of the manifold and this gate is vertically adjustable so that together the gate and open side face define an orifice slot or passageway from which a uniform curtain of the resin may flow onto a platemaking surface. The manifold member has a downward projecting wedge shaped lip which acts as a doctor blade on the liquid resin layer deposited as the manifold is moved across the plate-making surface.

3 Claims, 3 Drawing Figures

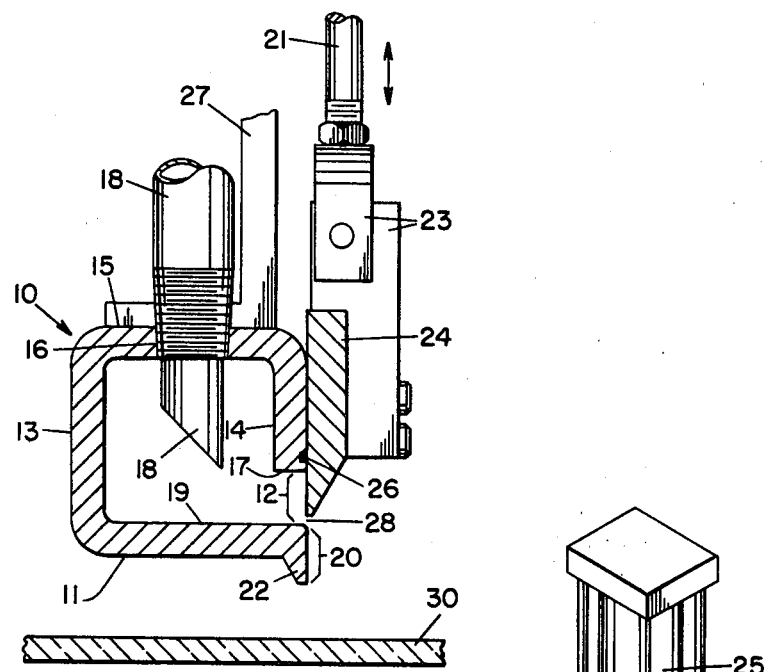
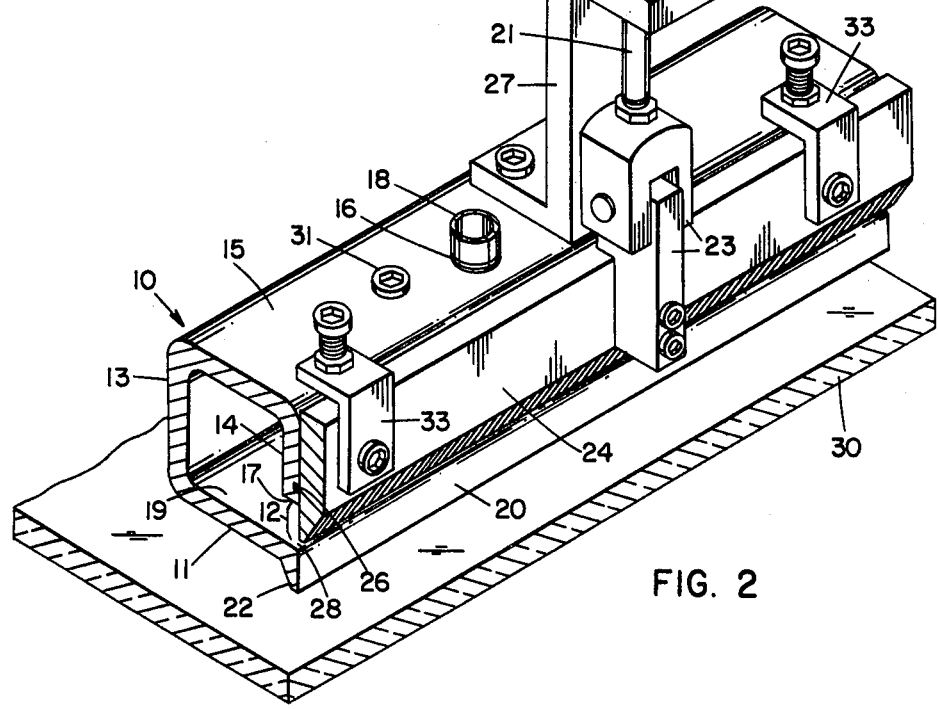

APPARATUS FOR PRODUCING A PRINTING PLATE

This application is a continuation-in-part of copending application Ser. No. 161,847, filed June 23, 1980, now abandoned.

SUMMARY OF THE INVENTION

The present invention relates to apparatus for the preparation of a photopolymerized printing plate. More particularly, this invention relates to apparatus which will provide a uniform layer of liquid photopolymerizable resin material for a printing plate, in which a regulated flow of photopolymerizable resin is supplied from an external reservoir into a manifold which is approximately C-shaped in cross-section and which has one at least partially open side face. A vertically adjustable gate is disposed before the open side face of the manifold and together the gate and open side face define an orifice slot or passageway from which a uniform curtain of the resin flows onto a platemaking surface. A wedge shaped lip projects downward from the manifold and acts as a doctor blade on the liquid resin layer deposited as the manifold is moved across the platemaking surface.

BACKGROUND OF THE INVENTION

Traditionally, plates for printing presses were produced by hand and were set with moveable type. This method later gave way to automatic machines, such as linotypes. In recent years, printing systems have been introduced which produce printing plates directly from photohardenable material. By exposing such a material to actinic light through a negative image, a selective hardening is obtained which can be used as a printing surface.

Most commonly, the material used for such plates is a liquid photopolymerizable resin. This resin must be spread in an even and uniform layer on a surface on which it is to be photopolymerized. Since the resin typically has a high viscosity, it is difficult to provide an even and uniform layer in a short period of time, and the longer the preparation time required, the greater the cost of the finished printing plate to the customer.

Most commonly, a layer of photopolymerizable material is applied by depositing a quantity of material on the platemaking surface and then spreading the material by drawing a doctor blade or nip roller along the plate. Various controls have been introduced in order to provide a more uniform deposit of material which is then spread along the platemaking surface. U.S. Pat. No. 3,957,015 shows a polymer flow control system for use in the manufacture of printing plates. The disclosed control system is used in conjunction with a pressurized feed system, and provides multiple spring tensioned dispense controls to assist in the proper distribution of the photopolymerizable material across the width of the platemaking surface. The deposited material is then spread along the platemaking surface in the lengthwise direction. In addition to the multiple dispense controls, footlike extenders at the periphery of the doctor blade are provided to prevent material from spreading beyond the platemaking area of the surface until the material can be spread.

Unfortunately, the use of either a doctor blade or a nip roller, or a combination of these mechanisms, to spread a large amount of viscous material leads to phenomena which prevent the deposition of an accurate and uniform layer. In the case of the use of a doctor blade, a slight cavitation occurs behind the blade as it passes along the plate, and the layer formed is slightly thinner than the height of the doctor blade along the platemaking surface. In the case of a nip roller, material tends to gather behind the roller as it moves along the plate and a layer formed by such a roller is slightly thicker than the height of the nip roller along the platemaking surface. The magnitude of either of these effects will depend on such variables as the speed of travel along the platemaking surface of the blade or roller, the viscosity of the material, and the amount of material before the blade or roller which must be moved along.

In addition, it is often customary to apply a sheet of plastic film over the layer of photopolymerizable resin to act as a substrate for the finished plate as shown in U.S. Pat. No. 3,837,884 to Akamatsu et al. This sheet is normally laid down by a large roller which follows the doctor blade or nip roller as it travels along the platemaking surface spreading the photopolymerizable resin. In the conventional art, variances in the thickness of the layer of photopolymerizable resin as a result of doctor blade or nip roller phenomena during spreading will also result in variances in thickness as a result of nip roller phenomena when such a substrate is placed over the layer in this manner.

Mechanisms such as tilt buckets or the bottom opening bucket shown in U.S. Pat. No. 4,056,423, have been used to bring some control to the flow of material onto the platemaking surface, thereby somewhat reducing the amount of material which the doctor blade or nip roller must move along the length of the plate, but there are certain problems associated with these mechanisms. Firstly, such a moveable reservoir must hold the entire amount of material used to make up the layer, usually with some excess to allow for the material's viscosity. Thus, such a reservoir must be of a substantial size, and must be refilled after each plate is made.

In addition, to attempt to keep a relatively constant flow of resin during the course of travel along the platemaking surface, the degree of tilt in a tilt bucket, or the width of the opening in a bottom opening bucket, must be varied as the reservoir travels along the surface. This is done to compensate for the speed of travel and the constantly changing relationship between the gravity head of the resin in the reservoir and the various other minor forces acting on the material.

To compensate for the irregularities caused by the prior art mechanisms, very often a larger amount of resin than needed was deposited and spread on the platemaking surface. Initially, this resulted in a layer thicker in the center and tapering toward the edges. Even after a wait of 2 or 3 minutes and using an upper weighted flat surface resting on the layer, a layer of uniform thickness might not result. A printing plate made using such a layer would produce dark areas of printing in the center of the plate with lighter areas around the edges.

Mechanisms have also been used which dispense material to the platemaking surface from an external reservoir under pressure. These mechanisms are generally more compact than the gravity fed systems above, since the reservoir is maintained externally. However, these mechanisms still have difficulty in providing a layer without localized irregularities. Increasing the number of orifices through which the material is delivered decreases such irregularities, but increases the possibility of introducing bubbles of trapped gas, which may render the resulting plate unusable. In addition, such multiple small orifices are subject to clogging, leading to irregularities which may also render the plate unusable.

OBJECTS OF THE PRESENT INVENTION

It is an object of the present invention to provide an apparatus capable of rapidly producing a uniform layer of liquid photopolymerizable material.

It is a further object of the present invention to provide in an apparatus for the production of photopolymerized printing plates, a means to rapidly provide a uniform layer of liquid photopolymerizable material which means comprises a manifold which spans the plateforming area of a surface and which can be moved transversely in order to provide from the manifold during its travel an essentially uniform curtain of liquid photopolymerizable material which is continuously fed under pressure into said manifold from an external reservoir.

The other objects, features, and advantages of the present invention are pointed out with particularity in the claims annexed to this specification. Further, they will become more apparent in light of the following detailed description of the preferred embodiment thereof and as illustrated in the accompanying drawings.

According to the preferred embodiment of the present invention an apparatus to rapidly provide a uniform layer of liquid photopolymerizable resin material for a printing plate is provided, which comprises: a platemaking surface; a vertically nonadjustable manifold spanning the width of the plate-making surface and moveable along the lengthwise direction of said surface, which manifold is approximately C-shaped in cross-section having a closed bottom side having a wedge shaped lip projecting downward from its forward edge and forming a doctor blade, a back facing side, an upper side, and a forward facing side depending toward but not in contact with the forward edge of said bottom side and defining an opening across the length of said manifold adjacent said bottom side, one of said upper or back facing sides being closed and the other having a plurality of openings for the attachment of resin supply tubes, and closed ends; a gate being essentially the same length as said manifold, disposed before the opening in the manifold adjacent the bottom side and vertically adjustable so that, when adjusted upward, its lower edge will define with the opening in the manifold an adjustable orifice slot extending the length of the opening in the manifold and when adjusted downward completely closing the opening in the manifold;

means to vertically adjust said gate upward and downward;

means to prevent air from entering the apparatus between the gate and the upper section of the forward facing side of the manifold; and means to supply a regulated flow of liquid photopolymerizable resin from a pressurized external reservoir through said resin supply tubes attached to said plurality of openings in said manifold.

It will be understood that the term "forward facing" used in the specification and claims refers to the direction in which the apparatus is moving when actually laying down a layer of liquid photopolymerizable resin for a printing plate. The term "backward facing" refers to the direction opposite from "forward facing".

It will be obvious to those skilled in the art that various means can be used to adjust the gate upward and downward. One such means is electrically actuated pneumatic cylinders. Such a means is shown below in the drawings. It may additionally be advantageous to provide stop brackets on the gate as shown in the drawings. The top brackets hold the gate tightly against the manifold and control the width of the orifice slot by limiting the upward travel of the gate.

BRIEF DESCRIPTION OF THE DRAWINGS

FIG. 1 shows a view of one embodiment of the present invention partly in cross-section.

FIG. 2 shows a perspective view of the same embodiment as FIG. 1.

In the drawings, like numbers are used for like parts.

DETAILED DESCRIPTION OF THE DRAWINGS

Figure 3:
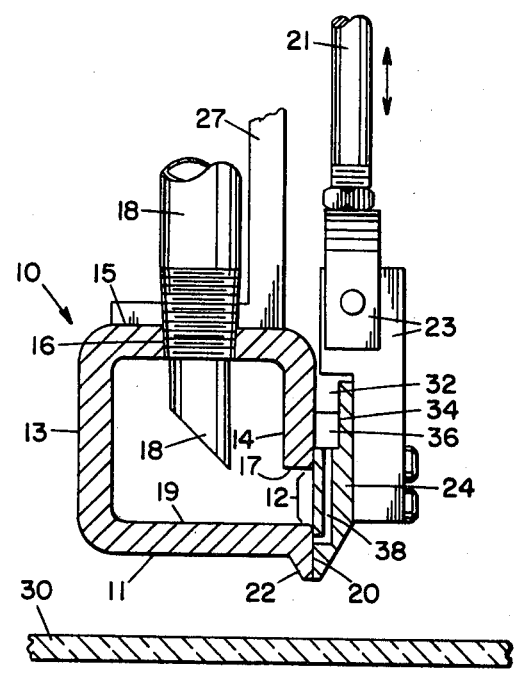
FIG. 3 shows a view of a second embodiment of the present invention partly in cross-section.

An embodiment of the apparatus of the present invention is shown in FIG. 1. As shown in cross-section, a manifold (10) is approximately C-shaped in cross-section. As shown, the manifold (10) has a closed bottom side (11) having a wedge shaped lip (22) projecting downward from its forward edge (20) forming a doctor blade, a closed backward facing side (13) an upper side (15) having a plurality of openings, one shown as (16) in FIG. 1, for the attachment of resin supply tubes, one shown as (18) in FIG. 1, and a forward facing side (14). Forward facing side (14) depends toward but does not contact bottom side (11). The lower edge (17) of the forward facing side (14) and the upper surface (19) of bottom side (11) define an opening (12) throughout the length of manifold (10). Photopolymerizable resin is supplied from an external reservoir through resin supply tubes such as (18), through the openings, such as (16), and into the enclosure of the manifold (10). In the embodiment shown in FIG. 1, the openings, such as (16), are in the upper side (15) of the manifold (10). When the resin is supplied to the manifold (10) through openings in the upper side (15), it is advantageous to extend the supply tube (18) downward into the manifold enclosure below the surface of the resin and to cut the end of it at a 45° angle for the reasons disclosed below. The manifold (10) has closed ends (not shown in the drawing).

A gate (24) is mounted against the forward facing side (14) of the manifold (10). It is advantageous to provide a sealing means between gate (24) and forward facing side (14) to prevent air from penetrating into the resin from above the opening (12). In FIG. 1, the sealing means is an elastomeric seal shown as (26) provided in a groove in the forward facing side (14) of the manifold (10). The gate (24) is vertically adjustable. The gate (24) is attached to connector rods (21) through attachment means (23). One of these rods (21) is shown in FIG. 1 attached to the gate (24) through connector rod attachment (23). The connector rods, such as (21), are driven upward and downward (shown by arrows) by a driving means (not shown in FIG. 1), thus adjusting the gate (24) vertically upward and downward. When the gate (24) is adjusted upward, it, together with the opening (12) in the forward facing side (14) of the manifold (10), defines an orifice slot (28) which will discharge a uniform curtain of photopolymerizable resin onto a platemaking surface (30). Also shown in FIG. 1 is the lower end of a bracket (27) used to position the driving means which drives the connector rod (21) upward and downward.

In FIG. 2, the embodiment of the apparatus shown in FIG. 1 is shown in a perspective view. In addition to the parts shown in FIG. 1, FIG. 2 shows a pneumatic cylinder (25), supported by bracket (27), used to drive the connector rod (21) and thus raise and lower the gate (24). Stop brackets (33) are shown in FIG. 2. The stop brackets (33) control the width of the orifice slot (28) by limiting the upward travel of the gate (24). The downward travel of the gate (24) is controlled by the connector rods (21) to prevent the gate (24) from being lowered below the wedge shaped lip (22). Also shown in FIG. 2 is a purge screw (31) which can be opened to allow air to escape from the manifold (10) when it is being filled with photopolymer resins.

The same parts as shown in FIGS. 1 and 2 are present in the embodiment shown in cross-section in FIG. 3; however, the structure of the means to prevent air from entering the apparatus is different. In FIG. 3 is shown a means to prevent air from entering the apparatus comprising a pocket (32) between the forward facing side (14) of the manifold (10) and a rabbet (34) cut out of the upper inner edge of the gate (24). As shown in FIG. 3, the pocket (32) is fed with liquid photopolymer resin (36) through a plurality of passageways, one is shown in FIG. 3 as (38), drilled into the gate (24) and when the gate is adjusted upward (i.e., is in the open position) connecting the bottom of the rabbet (34) with the opening (12) in the manifold (10). Thus a liquid seal of photopolymerizable resin is used to prevent air from entering the manifold (10).

The apparatus of FIG. 1 can be used to rapidly provide a uniform layer of liquid photopolymerizable resin material in the following manner.

A negative of the image to be printed is disposed above a transparent horizontal surface above an actinic light source and this negative is then covered with a thin sheet of protective film. Photopolymerizable material from an external reservoir is supplied under pressure to the interior of the manifold (10) through a plurality of resin supply tubes (18) attached to a plurality of openings (16) in the top side (15) of the manifold (10). Air is allowed to escape from the manifold (10) by opening purge screw (31). After the manifold (10) is filled with resin, the purge screw (31) is closed.

At some point the gate (24) disposed before the opening (12) in the forward facing side (14) is raised and adjusted until an orifice slot (28) of the desired height is defined between said gate (24) and the opening (12) in the forward facing side (14) of the manifold (10). Photopolymerizable material is allowed to flow from the interior of the manifold (10) as a uniform curtain through the orifice slot (28) and down the forward edge (20) of the bottom side (11) of the manifold (10) just below the opening (12) in the forward facing side (14) and onto the platemaking surface (30). A very small amount of material is allowed to build up to form a small bead across the platemaking surface (30).

The manifold (10) which is moveable along the lengthwise direction of the platemaking surface (30) is then moved from its initial position at one end of the platemaking surface toward the other end of the platemaking surface. This manifold (10) is positioned with its opening facing the direction of travel, and this movement causes the wedge shaped lip (22) projecting downward from the forward edge (20) of the bottom side (11) to act as a doctor blade on the material layer being deposited on the platemaking surface (30). The speed of travel of the manifold (10) is adjusted such that it will cooperate with the constant flow of material from the orifice slot (28) onto the platemaking surface (30) to maintain a bead of the same size during the travel of the manifold (10) along the platemaking surface.

In this manner, variances in the thickness of the layer as a result of the so-called doctor blade phenomena are substantially reduced, since the wedge shaped lip (22) forming the doctor blade is called on to push a small and constant amount of material along the platemaking surface (30).

When the manifold has completely traversed the platemaking area and a uniform layer of photopolymerizable material has been prepared and covered with a substrate film as desired, the material is selectively polymerized through the negative image by actinic light from the actinic light source. Unpolymerized material is removed by washing with a solvent in a separate step, and the finished plate may then be used. The specific solvent used to remove umpolymerized material will depend upon the photopolymer being used.

It may also be useful to provide a second actinic light source over the photopolymerizable resin layers, and this may be done with the present invention.

As indicated above, the apparatus contains means to prevent air from entering and possibly forming bubbles in the photopolymerizable resin and degrading the resulting printing plate. Depending upon the viscosity of the resin and the fit of the gate against the manifold, it is possible for air to leak into the apparatus between the gate and the section of the forward facing side of the manifold above the opening. Several different means to prevent air from entering the manifold can be used. For example, an elastomeric seal can be provided in a groove spanning the length of the manifold above the opening in the forward facing side of the manifold. Such a seal can be merely a strip of rubber or plastic which fits in the groove and seals against the gate. Another means which can be used in the apparatus of this invention is a liquid seal between the gate and the manifold. A preferred liquid seal can be formed in the shape of a pocket between the forward facing side of the manifold and a rabbet cut along the upper inner edge of the gate and spanning the length of the opening in the forward facing side. The pocket can be fed with liquid resin by a plurality of small passageways drilled into the gate, and when the gate is adjusted upward, connecting the bottom of the pocket with the opening in the forward facing side of the manifold. The number of passageways needed will depend upon the length of the gate, e.g., three to six being typical. Generally, the end walls (i.e., the walls at either end of the gate) of the pocket will be cut lower or a groove will be cut in the ends to provide an overflow for excess resin.

When operating the apparatus, the manifold will first be completely filled with liquid resin. In order to purge all air from the manifold, a purge screw can be loosened on the upper side of the manifold until liquid resin starts to leak out. The purge screw can either be a separate screw for that purpose or one of the screws in the brackets which hold the manifold. If the resin supply tubes enter the upper side of the manifold, it is preferable that the ends of the tubes extend downward below the surface of the resin during normal operation, in order to prevent the formation of air bubbles. It is also preferable to cut the end of the tubes at approximately 45° angle facing backward so that the liquid resin forms a uniform curtain as it leaves the manifold. If the resin supply tubes enter the backward facing side of the manifold, there is no problem with air bubbles and the resin supply tubes can be cut flush with the inner surface of the manifold. The actual number of resin supply tubes will depend upon the width of the manifold. With relatively short manifolds three tubes should be sufficient—longer manifolds may require four or more tubes.

The apparatus of this invention can be used with any of the well known liquid photopolymer resins for preparing printing plates. Typical resins which can be used in the apparatus and method of this invention are those disclosed in U.S. Pat. Nos. 3,687,785 and 4,137,081.

It will be obvious to those skilled in the art that the apparatus of this invention can be used to prepare printing plates of various thicknesses from only a few mils to an inch or more.

Other features, advantages and specific embodiments of this invention will become readily apparent to those exercising ordinary skill in the art after reading the foregoing disclosures. These specific embodiments are within the scope of the claimed subject matter unless otherwise expressly indicated to the contrary. Moreover, while specific embodiments of this invention have been described in considerable detail, variations and modifications of these embodiments can be effected without departing from the spirit and scope of the invention as disclosed and claimed.

What I claim and desire to protect by Letters Patent is:

1. An apparatus to provide a uniform layer of liquid photopolymerizable resin material on a platemaking surface in the manufacture of a printing plate from said resin, said apparatus comprising:

a platemaking surface;

a manifold spanning the width of the platemaking surface vertically nonadjustable with respect to the platemaking surface during movement thereover and moveable along the lengthwise direction of said surface, which manifold is approximately C-shaped in cross-section having a closed bottom side having a wedge shaped lip projecting downward from its forward edge and forming a doctor blade, a back facing side, an upper side, and a forward facing side depending toward but not in contact with the forward edge of said bottom side and defining an opening across the length of said manifold adjacent said bottom side, one of said upper or back facing sides being closed and the other having a plurality of openings for the attachment of resin supply tubes, and closed ends;

a gate being essentially the same length as said manifold, disposed before the opening in the manifold adjacent the bottom side and vertically adjustable so that, when adjusted upward, its lower edge will define with the opening in the manifold an adjustable orifice slot extending the length of the opening in the manifold and when adjusted downwardly completely closing the opening in the manifold;

means to vertically adjust said gate upward and downward;

means to prevent air from entering the apparatus between the gate and the upper section of the forward facing side of the manifold; and means to supply a regulated flow of liquid photopolymerizable resin material from a pressurized external reservoir through said resin supply tubes attached to said plurality of openings in said manifold.

2. The apparatus of claim 1 wherein the means to prevent air from entering the apparatus between the gate and the forward facing side of the manifold is an elastomeric seal provided in a groove spanning the length of the manifold above the opening in the forward facing side of the manifold.

3. The apparatus of claim 1 wherein the means to prevent air from entering the apparatus between the gate and the forward facing side of the manifold is a liquid seal of photopolymer resin material held in a pocket between the forward facing side of the manifold and a rabbet cut out of the upper inner edge of the gate, said rabbet extending essentially the length of the opening in the manifold, said liquid seal being fed by a plurality of passageways drilled into the gate and when the gate is adjusted upward connecting the bottom of the rabbet with the opening in the manifold.

* * * * *